US009075585B2

(12) United States Patent
Dinkjian et al.

(10) Patent No.: US 9,075,585 B2
(45) Date of Patent: Jul. 7, 2015

(54) INITIALIZING COMPONENTS OF AN INTEGRATED CIRCUIT

(75) Inventors: Robert Michael Dinkjian, Austin, TX (US); Giang Chau Nguyen, Austin, TX (US); James Mitchell Rakes, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 566 days.

(21) Appl. No.: 13/236,340

(22) Filed: Sep. 19, 2011

(65) Prior Publication Data

US 2012/0032716 A1    Feb. 9, 2012

Related U.S. Application Data

(63) Continuation-in-part of application No. 12/851,602, filed on Aug. 6, 2010, now abandoned.

(51) Int. Cl.
*G01K 7/01* (2006.01)
*G06F 13/00* (2006.01)
*G06F 1/20* (2006.01)

(52) U.S. Cl.
CPC ..................................... *G06F 1/206* (2013.01)

(58) Field of Classification Search
USPC .......... 374/170, 178, 171, 172, 183; 702/130, 702/99; 711/113, 118, 100; 327/142; 365/211, 212, 226; 707/642
See application file for complete search history.

(56) References Cited

U.S. PATENT DOCUMENTS

| 5,085,526 | A | * | 2/1992 | Sawtell et al. ................ 374/101 |
|---|---|---|---|---|
| 5,154,514 | A | | 10/1992 | Gambino et al. |
| 5,639,163 | A | | 6/1997 | Davidson et al. |
| 5,890,100 | A | | 3/1999 | Crayford |
| 6,002,991 | A | | 12/1999 | Conn, Jr. |
| 6,091,255 | A | | 7/2000 | Godfrey |
| 6,393,374 | B1 | * | 5/2002 | Rankin et al. ................. 702/132 |
| 6,694,282 | B2 | | 2/2004 | Perner |
| 7,006,943 | B1 | * | 2/2006 | Mitchell et al. ............... 702/132 |
| 7,034,507 | B2 | | 4/2006 | Lovett |
| 7,098,715 | B2 | * | 8/2006 | Severson ...................... 327/291 |

(Continued)

OTHER PUBLICATIONS

Chiueh, Herming; Choma, Jr., John; Draper, Jeffrey; Luh, Louis; "A High Speed CMOS On-Chip Temperature Sensor;" 4 pages; University of Southern California, Los Angeles, CA, USA.

(Continued)

*Primary Examiner* — Gail Kaplan Verbitsky
(74) *Attorney, Agent, or Firm* — D'Ambrosio & Menon, PLLC; Usha Menon

(57) ABSTRACT

Methods, systems, and computer program products for initializing one or more components of a system, the system comprising an integrated circuit that comprises at least one processor, are disclosed. A method includes initializing at least one component of the system, determining a temperature of the integrated circuit using a temperature sensing device embedded on the integrated circuit, comparing the determined temperature to a predetermined suitable temperature operating range of at least one additional component to yield a comparison result, and initializing the at least one additional component based on the comparison result. The at least one additional component may be initialized on the condition that the determined temperature of the integrated circuit is within the predetermined suitable temperature operating range of the at least one additional component.

7 Claims, 3 Drawing Sheets

(56) References Cited

U.S. PATENT DOCUMENTS

| | | | |
|---|---|---|---|
| 7,187,053 | B2 | 3/2007 | Boerstler et al. |
| 7,197,420 | B2 | 3/2007 | Johns et al. |
| 7,255,476 | B2 | 8/2007 | Franch et al. |
| 7,340,366 | B2 * | 3/2008 | Aas et al. .................. 702/130 |
| 7,410,293 | B1 | 8/2008 | Santurkar et al. |
| 7,452,128 | B2 | 11/2008 | Franch et al. |
| 7,563,023 | B2 | 7/2009 | Kuo et al. |
| 7,645,071 | B2 | 1/2010 | Franch et al. |
| 7,661,878 | B1 | 2/2010 | Lall et al. |
| 7,760,569 | B2 * | 7/2010 | Ruf et al. ................... 365/211 |
| 8,033,720 | B2 * | 10/2011 | Chu .............................. 374/178 |
| 2001/0021217 | A1 * | 9/2001 | Gunther et al. ............. 374/178 |
| 2004/0037346 | A1 * | 2/2004 | Rusu et al. .................. 374/121 |
| 2004/0204899 | A1 * | 10/2004 | Gunther et al. ............. 702/132 |
| 2006/0220707 | A1 * | 10/2006 | Kang et al. .................. 327/112 |
| 2006/0242447 | A1 * | 10/2006 | Radhakrishnan et al. .... 713/501 |
| 2007/0010963 | A1 * | 1/2007 | Gaskins ........................ 702/132 |
| 2007/0210756 | A1 * | 9/2007 | Choi et al. ................... 320/128 |
| 2012/0201273 | A1 * | 8/2012 | Mukherjee .................. 374/183 |
| 2013/0235903 | A1 * | 9/2013 | Wong et al. ................. 374/178 |

OTHER PUBLICATIONS

Hwu, Jenn-Gwo; Shih, Yen-Hao; "An On-Chip Temperature Sensor by Utilizing a MOS Tunneling Diode;" IEEE Electron Device Letters, vol. 22, No. 6, Jun. 2001; pp. 299-301; Department of Electrical Engineering, Graduate Institute of Electronics Engineering, National Taiwan University, Taipei 106, Taiwan, R.O.C.

Abshire, Pamela A.; Cohen, Marc H.; Prakesh, Somashekar B.; Zhai, Yiming; "Detection of On-chip Temperature Gradient Using a 1.5V Low Power CMOS Temperature Sensor;" 2006 IEEE; pps. 1171-1174; Department of Electrical and Computer Engineering, University of Maryland, College Park, MD, USA.

Maxim Integrated Products; "The MAX1464's On-Chip Temperature Sensor;" Dec. 19, 2005; pp. 1-5.

Lapedus, Mark; "NEC Develops On-Chip Temperature Sensor Tech;" Global Sources, EE Times India; Jun. 19, 2008; pp. 1-3.

Co-pending U.S. Appl. No. 12/851,602, filed Aug. 6, 2010.

* cited by examiner

INITIALIZING COMPONENTS OF AN INTEGRATED CIRCUIT

CROSS-REFERENCE TO RELATED APPLICATION

This application is a continuation-in-part of U.S. application Ser. No. 12/851,602 filed on Aug. 6, 2010.

BACKGROUND

Bringing up a system, such as an integrated circuit, in a hostile environment presents several challenges because, among other things, components of an IC chip typically operate at different conditions. For example, the PLL (phase-locked loop) and eDRAM components of a chip may require a warmer temperature range than other chip components in order to function adequately.

SUMMARY

In one embodiment of the invention, a method for initializing one or more components of a system, the system comprising an integrated circuit that comprises at least one processor, is disclosed. The method comprises: initializing at least one component of the system; determining a temperature of the integrated circuit using a temperature sensing device embedded on the integrated circuit; comparing the determined temperature to a predetermined suitable temperature operating range of at least one additional component to yield a comparison result; and initializing the at least one additional component based on the comparison result.

In another embodiment of the invention, a system for initializing one or more components of an integrated circuit is disclosed. The system comprises: a temperature sensing device embedded on the integrated circuit that determines a temperature of the integrated circuit; and at least one processor. The at least one processor initializes at least one component of the integrated circuit; compares the determined temperature to a predetermined suitable temperature operating range of at least one additional component to yield a comparison result; and initializes the at least one additional component based on the comparison result.

In another embodiment of the invention, a computer-readable medium storing computer program code for causing a computer to perform a process, the computer comprising an integrated circuit, is disclosed. The process comprises instructions for: initializing at least one component of the integrated circuit; determining a temperature of the integrated circuit using a temperature sensing device embedded on the integrated circuit; comparing the determined temperature to a predetermined suitable temperature operating range of at least one additional component to yield a comparison result; and initializing the at least one additional component based on the comparison result.

These and other embodiments of the invention are described in detail with reference to the following drawings.

DETAILED DESCRIPTION

Figure 1:
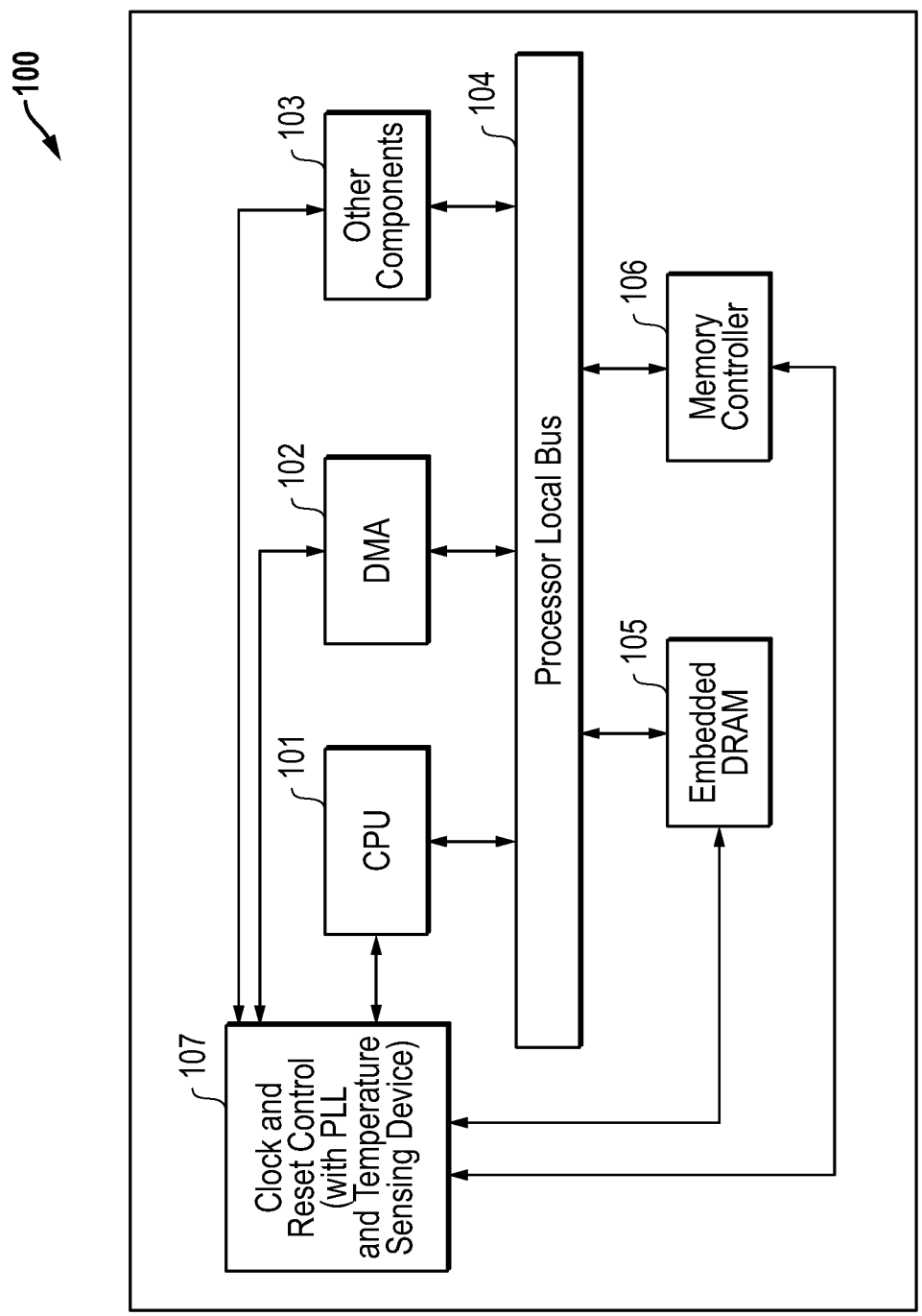
FIG. 1 depicts a schematic block diagram of a system in accordance with one or more embodiments of the invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. A computer readable storage medium may be a transitory or a non-transitory medium, for example, but not limited to, an electronic, magnetic, optical, electro-magnetic, infrared, or semiconductor system, apparatus, or device, or any suitable combination of the foregoing. More specific examples (a non-exhaustive list) of non-transitory computer readable storage media include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to FIG. 1, a schematic block diagram of a system 100 in accordance with one or more embodiments of the invention is shown. The system may be, for example, a System-On-a-Chip (SOC) in which the various components are integrated on a single integrated circuit. In the alternative, the system may be an Application-specific integrated circuit (ASIC) that is customized for a particular use, an application specific standard product, or an industry standard integrated circuit. Alternately, the system 100 may be a combination of any number of integrated circuits such that the various components shown are distributed across the integrated circuits. One of ordinary skill in the art will appreciate that the system 100 may take on various forms depending on the particular characteristics of the computing environment in which it will be employed.

The system 100 includes a central processing unit (CPU) 101 which may include one or more microprocessors, direct memory access 102, embedded dynamic random access memory (DRAM) 105, a memory controller 106, and various other components 103. One of ordinary skill in the art will appreciate that the other components 103 may include additional memory blocks in the form of ROM, RAM, EEPROM, and Flash memory, external interfaces including industry standards such as USB, Firewire, Ethernet, USART, or SPI, analog interfaces, voltage regulators, power management circuits, or any other suitable or desired component. The system 100 additionally includes a processor local bus 104 through which the CPU 101 may communicate with, read data from, or write data to at least the embedded DRAM 105, the memory controller 106, the direct memory access 102, and the other components 103. The system 100 further includes a clock and reset control module 107. The clock and reset control module 107 may include timing sources such as oscillators and phase-locked loops (PLLs). The clock and reset control module 107 may also include peripherals such as counter-times, real-time timers and power-on reset generators.

In addition, the clock and reset control module 107 may comprise a temperature or thermal sensing device. The temperature sensing device may alternatively be provided outside of the clock and reset control module 107. In either case, in accordance with one or more embodiments of the invention, the temperature sensing device is embedded on the system 100. As noted previously, in one or more embodiments of the invention, the system 100 may be a SOC or an ASIC. In these embodiments the temperature sensing device may be embedded on the integrated circuit.

Booting up an integrated circuit (IC) chip or system in a hostile environment such as an arctic environment in which average temperatures are significantly lower than typical temperatures at which the IC chip or system is generally designed to operate presents several challenges. Certain chip components may require different temperature ranges than those required by other components in order to function properly. For example, assuming that an IC chip is being booted up in a particularly cold environment, the phase-locked loop and eDRAM components of the IC chip may require warmer temperature ranges than what other components require in order to operate adequately. Certain components of the chip may be capable of being initialized or enabled during initial stages of the boot-up process at lower ambient temperatures, while other components (such as the PLL and the eDRAM components) may require the ambient temperature around the chip to rise to an appropriate level by, for example, the heat generated during the boot-up process before these components may be enabled or initialized. Similarly, in an environment in which temperatures exceed the typical temperatures at which components of an IC chip are designed to operate at, certain components may require the ambient temperature around the chip to cool to a certain level before these components may be enabled or initialized and expected to perform properly.

Conventional systems employ a thermal sensing device disposed externally to the IC chip to indicate when the temperature conditions are appropriate for the chip to be powered up. The use of an external temperature sensing device is costly as it must be separately manufactured and installed in the system. In addition, temperature measurements obtained from an external thermal sensing device are often inaccurate due to the inability of the external thermal sensing device to accurately measure the junction temperature of the chip. As such, the inherent inaccuracy of measurement of external thermal sensing devices results in longer chip boot-up times caused by the necessity to compensate for the measurement error.

Embedding the temperature sensing device within or on an IC chip (i.e. forming the temperature sensing device from the same wafer of semiconductor material as other components of the IC chip) provides distinct advantages over conventional systems that employ an external temperature sensing device. Embedded temperature sensing devices in accordance with one or more embodiments of the invention results in significant cost reductions as compared to external devices. An embedded temperature sensing device according to one or more embodiments of the invention is relatively small and generally will not require an increase in the die size of the IC chip. Further, embedded temperature sensing devices are capable of more accurately measuring the junction temperature of the IC chip, and thus do not suffer from the measurement inaccuracies of external thermal sensing devices and the resultant longer chip boot-up times.

In accordance with one or more embodiments of the invention, one or more reset sequences may be employed in conjunction with the system 100 of FIG. 1 that comprises an embedded temperature sensing device in order to perform a booting-up or bringing-up process of the system in an effective and efficient manner. An example of such a reset sequence in accordance with an embodiment of the invention is depicted in the flow chart of FIG. 2.

Figure 2:
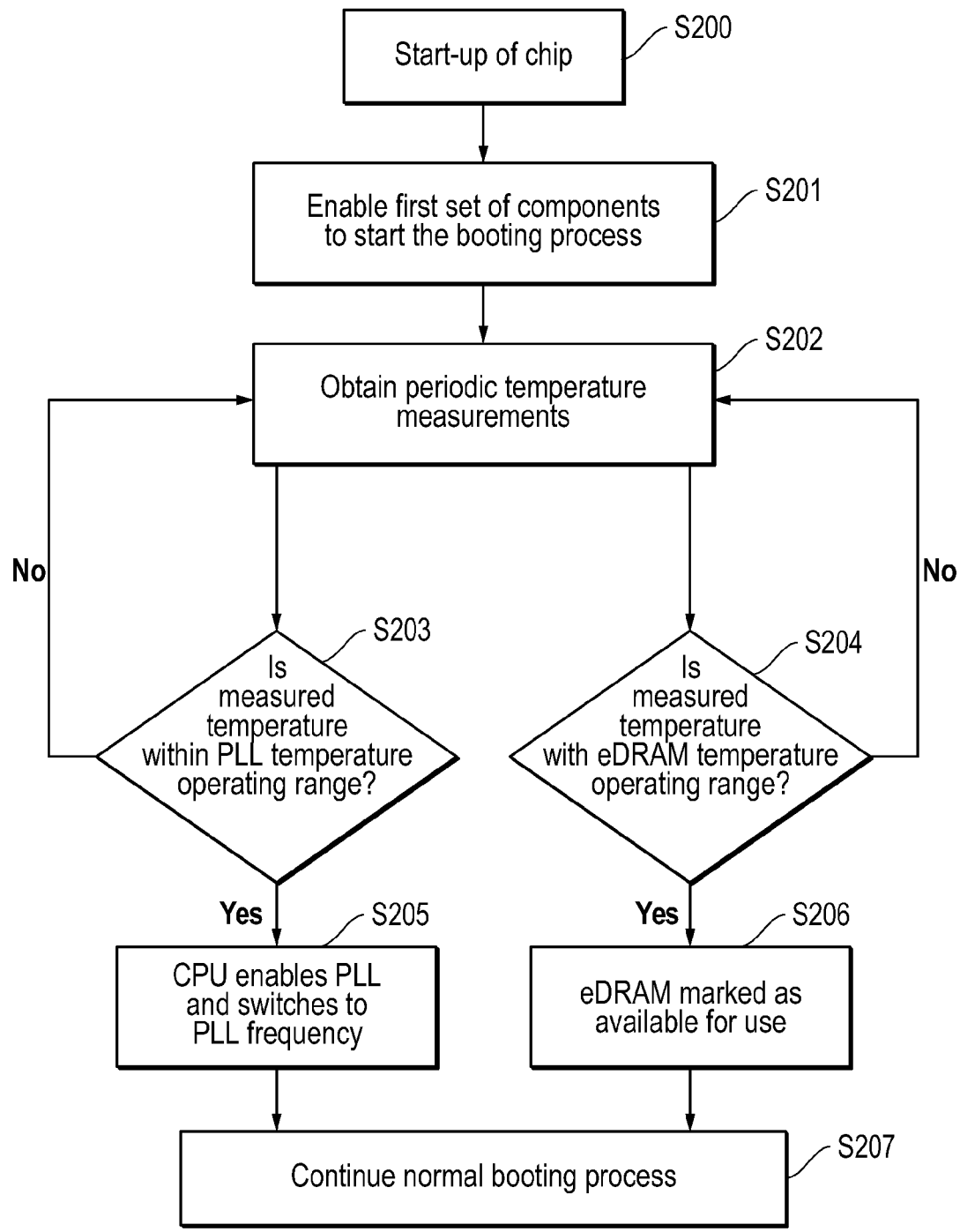
FIG. 2 depicts a flow chart illustrating a method in accordance with an embodiment of the invention.

According to an embodiment of the invention, in the method depicted in FIG. 2, a start-up of the IC chip is initiated (S200). Prior to or at the start-up of the chip, all components of the chip may be in a reset state. The start-up of the chip may include running the system BIOS to enable the processor.

Although this method is described with reference to a single integrated circuit chip, one of ordinary skill in the art will appreciate that this method may be applicable to any suitable system. In step S201, a first set of components may be enabled to start the booting-up process. The first set of components may include only those components that are known to function at startup conditions. As part of either step S200 and/or S201, the CPU (which may be one or more microprocessors) is enabled and a clock signal associated with the CPU may be synchronized with a reference clock signal that is slower than the phase-locked loop (PLL) clock signal. Further, at this stage, the CPU cache memory may be disabled. In addition, the first set of components that are enabled in step S201 may include read-only memory (ROM) modules and various other components that are capable of operating at the current chip temperature and that do not necessarily require a specific temperature range to be present in order to function properly.

In step S202, periodic temperature measurements are recorded by the temperature sensing device that is embedded on the chip. Then, in steps S203 and S204, the periodic temperature measurements are compared to a normal PLL temperature operating range and a normal DRAM temperature operating range, respectively, to yield comparison results. In one or more embodiments of the invention, the CPU may be provided with a set of software instructions that enables the CPU to perform the required comparisons of steps S203 and S204. If it is determined in step S203 that the measured temperature falls within the PLL temperature operating range, then in step S205, the PLL is enabled and the CPU clock signal is synchronized with the faster PLL clock signal. The PLL may be, for example, a clock generator PLL that multiplies a lower frequency reference clock up to the operating frequency of the CPU. Similarly, if it is determined in step S204 that the measured temperature is within the eDRAM temperature operating range, in step S206, the eDRAM is marked as available for use by the CPU. Thereafter, in step S207, the booting-up process of the chip is continued.

The enabling of the first set of components in step S201 may be thought of as occurring independently of the temperature measurements. That is, the first set of components includes those chip components that are capable of operating at the current chip temperature and do not require a change in the temperature to a specific temperature range in order to operate properly. Further, although the reset sequence or method depicted in FIG. 2 only explicitly discusses a comparison of the measured temperature with the PLL temperature operating range and the eDRAM temperature operating range, any number of other components may be enabled based on a comparison result obtained by comparing the periodic temperature measurements to a specified temperature operating range for that component. For example, various forms of memory such as cache SRAM, non-cache SRAM, double data rate (DDR) memory such as DDR SRAM, DDR SDRAM, as well as any number of other IC chip components may be enabled based on a comparison of the periodic temperature measurements obtained from the embedded temperature sensing device to a specific temperature operating range that corresponds to the component.

Figure 3:
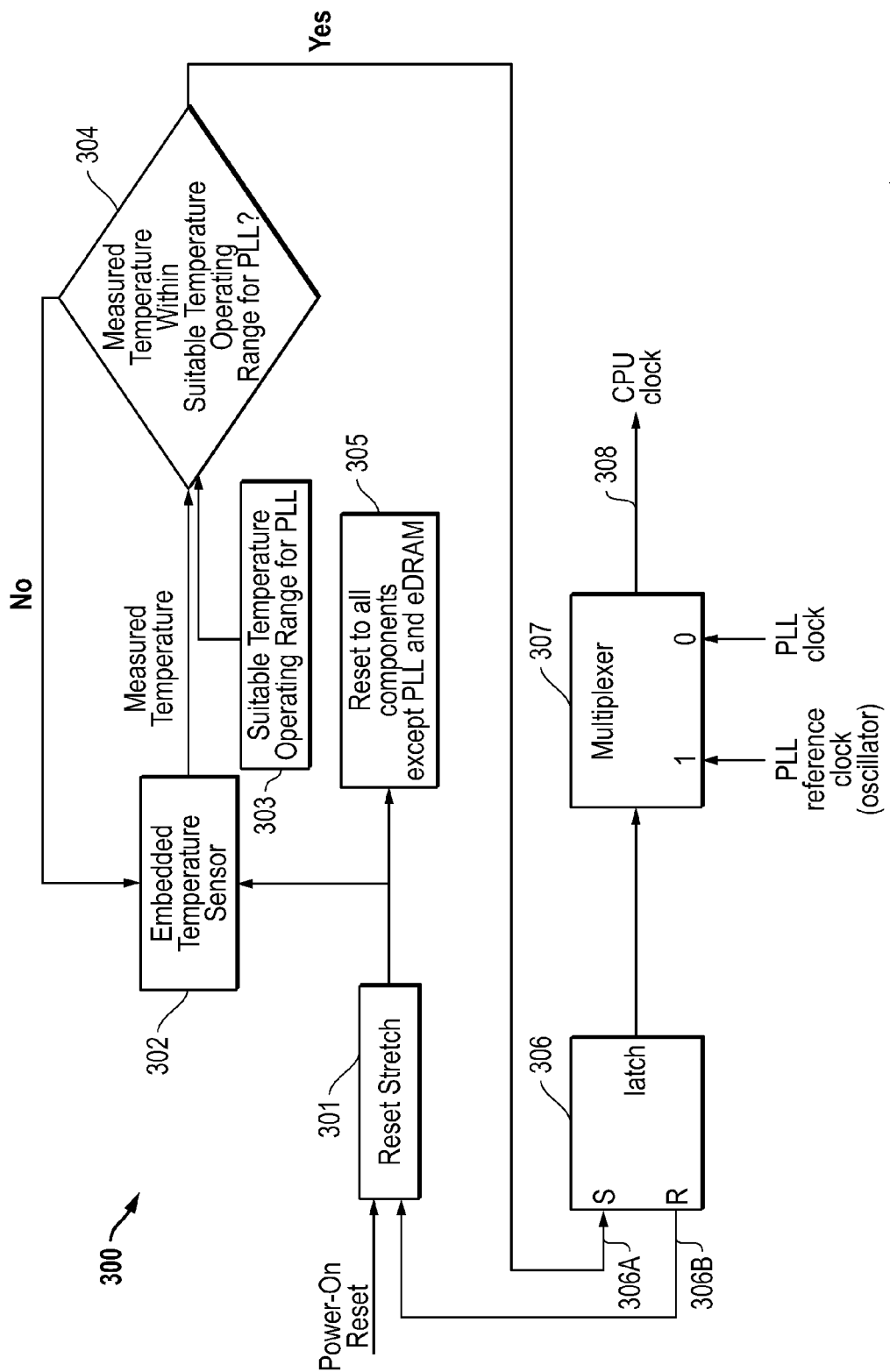
FIG. 3 depicts a flow chart illustrating a method in accordance with an embodiment of the invention.

FIG. 3 provides a flow chart that illustrates an embodiment of the invention. The embodiment shown in FIG. 3 should not be viewed as limiting and one of ordinary skill in the art will appreciate that numerous variations of the embodiment are within the scope of the invention.

The implementation 300 depicted in FIG. 3 begins with a power-on reset that initiates a reset stretch 301 that applies a reset 305 to all components excluding the PLL and the eDRAM. To reiterate, this specific implementation is not limiting and other implementations that do not reset other IC chip components are clearly within the scope of the invention.

An embedded temperature sensor 302 such as that previously described is provided. The temperature sensor 302 obtains periodic temperature measurements of the chip temperature. At decision block 304, a comparator (which may be the CPU itself) compares the temperature measurements obtained by the temperature sensor 302 with the suitable temperature operating range for the PLL 303. If it is determined that the measured temperature does not fall within the suitable temperature operating range for the PLL, then the comparator continues to perform comparisons of the periodic temperature measurements to the suitable temperature operating range of the PLL.

If it is determined that the measured temperature does fall within the suitable temperature operating range for the PLL, then an input 306A to the S-R latch 306 is toggled. As part of the initial booting-up of the chip, an additional input 306B is also provided to the S-R latch 306. As such, until the input 306A is toggled when the measured temperature is within the suitable temperature operating range for the PLL, the S-R latch provides a control signal to the multiplexer 307 that results in a mapping of the input representative of the reference clock signal to the CPU clock signal. In other words, as long as the measured temperature is not within the suitable temperature operating range for the PLL, the CPU clock signal is synchronized to the reference clock signal.

However, when the input 306A is toggled based on the measured temperature being within the suitable temperature operating range for the PLL, the S-R latch 306 provides a control signal to the multiplexer 307 that results in a mapping of the faster PLL clock to the CPU clock. That is, the CPU clock signal is synchronized with the faster PLL clock. In one or more embodiments of the invention, the multiplexer 307 may be a glitchless multiplexer.

FIG. 3 depicts a specific implementation according to one or more embodiments of the invention. However, one of ordinary skill in the art will appreciate that numerous other implementations that involve other reset sequences and additional components are within the scope of the invention.

The flowchart and block diagrams in the Figures illustrate the architecture, functionality, and operation of possible implementations of systems, methods and computer program products according to various embodiments of the invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose.

What is claimed is:

1. A method for initializing one or more components of a system, the method comprising:
    initializing at least one component of the system, the system comprising an integrated circuit that comprises at least one processor, the system further comprising a reference clock and a phase-locked loop;

determining a temperature of the integrated circuit using a temperature sensing device embedded on the integrated circuit;

comparing the determined temperature to a predetermined suitable temperature operating range of at least one additional component to yield a comparison result; and initializing, in dependence on the comparison result, the at least one additional component, wherein prior to the initializing the at least one additional component:

the at least one processor is enabled, and a clock signal associated with the at least one processor is synchronized with a signal of the reference clock, wherein the signal of the reference clock is slower than a signal of a clock associated with the phase-locked loop, and wherein the initializing the at least one additional component further comprises:

synchronizing the clock signal of the at least one processor with the phase-locked loop clock signal on the condition that the determined temperature is within a predetermined suitable temperature operating range for the phase-locked loop.

2. The method of claim 1, wherein the system further comprises a multiplexer, and wherein a mapping signal is provided to the multiplexer to synchronize the clock signal associated with the at least one processor with the reference clock signal.

3. The method of claim 1, wherein prior to the initializing the at least one component, all components of the system are in a reset state.

4. The method of claim 1, wherein the initializing the at least one additional component based on the comparison result comprises enabling cache memory of the at least one processor on the condition that the determined temperature of the integrated circuit is within a predetermined suitable temperature operating range of the cache memory.

5. The method of claim 1, wherein the clock signal of the at least one processor is continued to be synchronized with the reference clock signal as long as the determined temperature is outside the predetermined suitable temperature operating range of the phase-locked loop.

6. The method of claim 5, wherein the clock signal of the at least one processor is set to a clock signal of the phase-locked loop.

7. The method of claim 1, wherein the determining a temperature of the integrated circuit comprises obtaining periodic measurements of the temperature of the integrated circuit at specified intervals from the temperature sensing device.

* * * * *